US008746175B2

(12) United States Patent
André

(10) Patent No.: US 8,746,175 B2
(45) Date of Patent: Jun. 10, 2014

(54) METHOD OF AND DEVICE FOR MANAGING A GROUP OF DAIRY ANIMALS, AS WELL AS A COMPUTER PROGRAM PRODUCT THEREFOR

(75) Inventor: Gerrit André, Dronten (NL)

(73) Assignee: Maasland N.V., Maassluis (NL)

( * ) Notice: Subject to any disclaimer, the term of this patent is extended or adjusted under 35 U.S.C. 154(b) by 692 days.

(21) Appl. No.: 12/629,905

(22) Filed: Dec. 3, 2009

(65) Prior Publication Data

US 2010/0170445 A1 Jul. 8, 2010

Related U.S. Application Data

(63) Continuation of application No. PCT/NL2008/000061, filed on Feb. 27, 2008.

(51) Int. Cl.
*A01K 5/02* (2006.01)

(52) U.S. Cl.
USPC ..................... 119/14.02; 119/51.02

(58) Field of Classification Search
USPC .............. 119/14.02, 51.02, 720, 14.15, 14.18
See application file for complete search history.

(56) References Cited

U.S. PATENT DOCUMENTS

| 4,463,353 A | 7/1984 | Kuzara |
| 4,517,923 A | 5/1985 | Palmer |
| 2003/0061998 A1 | 4/2003 | Voogd et al. |

FOREIGN PATENT DOCUMENTS

| AU | 2006202426 A1 | 12/2006 |
| EP | 0095883 A | 12/1983 |
| EP | 1264536 A | 12/2002 |
| EP | 1369030 A2 | 12/2003 |
| EP | 1392109 B1 | 8/2005 |
| EP | 1731027 A | 12/2006 |
| EP | 1790218 A | 5/2007 |
| GB | 1278481 A | 6/1972 |
| JP | 04304827 | 10/1992 |
| WO | 8601977 A1 | 4/1986 |
| WO | 9600003 A1 | 1/1996 |
| WO | 9747187 A1 | 12/1997 |
| WO | 9903330 A1 | 1/1999 |
| WO | 0247473 A | 6/2002 |
| WO | 2005067704 A1 | 7/2005 |
| WO | 2006015018 A2 | 2/2006 |
| WO | 2006068582 A | 6/2006 |

OTHER PUBLICATIONS

"Prototype van een Dynamisch Krachtvoer Advies Systeem voor Melkvee"; PraktijkRapport Rundvee 37, Wageningen, Oct. 2003.
"De voederconversie van melkvee"; Rapport 20, Animal Sciences Group, Wageningen, Jan. 2007.
"Perspectieven voor de melkveehouderin", Proefstation voor de rundveehouderij, schaapenhouderij en paardenhouderij (PR) Lelystad; Publikatie nr. 48, Oct. 1987 (cited as background art).

*Primary Examiner* — Yvonne R. Abbott
(74) *Attorney, Agent, or Firm* — Hoyng Monegier LLP; Coraline J. Haitjema; David P. Owen

(57) ABSTRACT

The invention provides a method of managing a group of dairy animals including individually recognizing each animal by an animal identification system, milking the animals to give actual milk yields for each animal, and feeding the animals with an predetermined individual ration, collecting data regarding the group of dairy animals, which data comprise for each animal at least the actual milk yield and an amount of the individual ration consumed by the animal, wherein subsequent individual milk yields are estimated using a model on the basis of said data, and wherein, for one or more animals, at least one of the individual ration and the milking of individual dairy animals is adjusted in a regulatory step of the model using a precondition. The invention also provides a device and a computer program product, arranged to perform such a method.

18 Claims, 2 Drawing Sheets

METHOD OF AND DEVICE FOR MANAGING A GROUP OF DAIRY ANIMALS, AS WELL AS A COMPUTER PROGRAM PRODUCT THEREFOR

CROSS REFERENCE TO RELATED APPLICATIONS

This application is a continuation of international application number PCT/NL2008/000061 and claims priority from Netherlands application number 1033926 filed on Jun. 3, 2007, the contents of which are hereby incorporated by reference in their entirety.

BACKGROUND OF THE INVENTION

1. Field of the Invention

The present invention relates to a method of and a device for managing a group of dairy animals, as well as a computer program product therefor. Further, the invention relates to a method of managing a group of dairy animals, wherein each animal can be recognized individually through an animal identification system and wherein the animals are milked automatically by a milking device and give an individual milk yield.

2. Description of the Related Art

A method of feeding dairy cattle that are milked automatically, wherein the individual response of dairy animals to feed in terms of milk yield is determined by means of a dynamic model, is described in "PraktijkRapport Rundvee 37", by Van Duinkerken et al. (Wageningen, 2003).

It has been established that, in actual practice, this method does not always produce the most economical results and that it does not take account of other factors that may be unfavourable, such as, for instance, the health of the cows.

BRIEF SUMMARY OF THE INVENTION

The purpose of the present invention is to eliminate at least part of the above-mentioned disadvantages or at least to provide an alternative for the known method. In particular, the invention provides a method of managing a group of a plurality of dairy animals, wherein each animal can be recognized individually by an animal identification system, wherein the animals are milked and give an individually realized milk yield and wherein the animals are fed with an individual ration, wherein data regarding the group of dairy animals are collected, which data comprise at least the individually realized milk yields and the consumed rations, wherein subsequent individual milk yields are estimated by a model on the basis of said data, wherein, for one or more animals, at least one of the individual ration and the milking of individual dairy animals is adjusted in a regulatory step under application of a precondition. Of course, it will subsequently be possible to supply the ration concerned or to perform the related milking action. As a precondition has been provided, other circumstances can be taken into account. In this way management can be improved because it is not exclusively focused on maximizing the milk yield of each individual dairy animal. Of course, the precondition in this case should not be "maximizing the milk yield of each individual dairy animal".

The precondition can be of several types. Various embodiments will be mentioned and discussed hereinafter.

In one embodiment, the precondition comprises that a predicted feed balance of an individual dairy animal is higher after the regulatory step than the realized feed balance prior to the regulatory step, wherein a realized and predicted feed balance, respectively, is equal to the return of the associated realized and predicted milk yield, respectively, minus the costs of the associated realized and predicted ration, respectively. Of course, "directly prior to" is meant by this, so that each time there is not another regulatory step with respect to the ration or milking between the considered steps. A significant advantage of the above-mentioned precondition is that we are not so much looking at the total milk yield, but rather at the efficiency of the dairy animal. After all, it seldom makes sense to have a dairy animal produce more milk if it costs more than what it generates in income. Moreover, such diminishing efficiency is often a sign that overfeeding is taking place or at any rate that there might be health risks. However, it will also be obvious that the milk producing potential of the ration is not being optimally utilized.

In another embodiment, the precondition comprises that, for the group as a whole, the sum of predicted feed balances of individual dairy animals after the regulatory step is larger than the sum of realized feed balances prior to the regulatory step. This provides a an advantage, because we are looking here at the group as a whole, instead of (only) at individual animals. For instance, it is possible and in actual practice almost always the case, that not all animals convert their ration equally effectively into milk. In one embodiment, each individual animal should not be brought to its individual maximum with regard to feed balance, but for instance only the animals that are the most efficient in terms of feed. This embodiment is perhaps somewhat less advantageous if there is unlimited feed and milk capacity available, but it may produce a very significant advantage, especially when additional preconditions apply. For instance, making optimum use of it will be of an advantage if there is only a limited amount of feed available due to of drought or some similar condition.

The ration may comprise an amount of concentrate per day or an energy equivalence thereof. Because of its high specific energy content, concentrate is very suitable for controlling milk yield.

The ration may also comprise at least a second kind of feed, in particular an amount of roughage. Although roughage is not always suitable as a control variable, i.e. adjusting variable, as it is often freely available, it can nevertheless sometimes be useful to be able to also control this kind of feed and to make the second kind of feed an adjusting variable in the regulatory step as well. For instance, in doing so, animal-specific elements can be modelled on the concentrate intake, such as displacement or, exactly the opposite, a reinforcing effect on this concentrate intake.

In particular, the animals are fed at least partly by a computer-controlled feeding device. Although feeding by hand is also possible, such computer-controlled feeding offers advantages with respect to precision and limitation of human labour because the device can provide feed all day long. In another embodiment, the feeding device comprises a feed meter to establish feed quantities. In yet another embodiment, the feed meter is suitable for measuring at least two kinds of feed or rations. In particular, the device comprises a mixing device to mix at least two kinds of feed, because it has been established that, sometimes, offering mixed feed has positive effects on milk yield.

In yet another embodiment, the precondition comprises that the sum of the individual milk yields does not exceed a predetermined milk quota. In such a case, it is of course impossible or even not allowed to produce milk in excess of the allocated milk quota. This may be due to the content of storage tanks or similar devices, but, in practice, this will rather relate to the milk quota provided by the government. In such case, when the production ceiling is given, maximizing per individual dairy animal will often not produce the optimum result. Indeed, an efficient dairy animal provides a higher feed balance with a similar quantity of milk. It may also be so that the value of a similar milk yield is higher for one dairy animal than for another one, for instance, because of a higher fat content. Application of the present idea of looking at the whole group and of optimising the result of this may then produce a better result.

In a further embodiment, the precondition comprises that a total duration of milking all dairy animals is at the most equal to an effective daily milking time. For instance, a day has only 24 hours, during which a milker has only a limited capacity. Rations should not be such more milk is produced than one is able to milk. One could also call this a sort of milk quota. Here also, optimising for the group may produce better results.

In particular, the effective daily milking time is measured as a function of said effective daily milking time in a predetermined number of previous days and, more particular, a running average thereof. For instance, changes in the skill of the milker can thus be discounted. In fact, we already can consider this a dynamic model, in which also other numbers than the adjusting variables can vary over time, although one could also consider the effective daily milking time to be a variable.

Further, the animals are milked automatically by a milking device, which is preferably computer-controlled, for instance an automatic milking system (AMS), such as a milking robot. Like with a computer-controlled feeding device, this can provide advantages regarding precision and ease of use. The dairy animals can be milked at any desired moment, thus, for instance, also more often than twice a day. It has been established that this often produces a higher total daily milk yield.

In particular, the precondition comprises that a total duration of milking all dairy animals by the milking device is at the most equal to an effective daily milking time of the milking device; even an automatic milking device has a maximum milking time per day. This time is limited, for instance, by the times required for cleaning and/or maintenance of the device, by the times during which no dairy animal presents itself, by times during which a dairy animal that cannot or may not (yet) be milked is presenting itself and thus has to leave the AMS again, etc. This precondition can again provide an extra adjusting variable or decision criterion in the model. Indeed, not every dairy animal has an equally high milking speed. Consequently, if there is no unlimited milking time available, one might opt in the model to have more milk production take place by a dairy animal that gives its milk in relatively less time. In addition, interval sensitivity, i.e. the (relative or absolute) change of milk yield in case of a change in the milking interval, is not equal for every dairy animal. We can thus also vary this parameter when we are looking for an optimum result.

A milking interval, a milk vacuum, a suction/rest ratio during milking and/or a milking program for application during milking is advantageously adjustable. As already mentioned above, a shorter milking interval can increase the total daily milk yield. Under application of the precondition that there may be a maximum milking time, an optimal milking interval can then be chosen. This can thus also be either a dynamic coefficient or a variable or adjusting variable. Such considerations are also valid for the milk vacuum, which can be set higher for some dairy animals if they give their milk easily, as well as for the suction/rest ratio and a milking program that, for instance, comprises or only comprises a special post-milking program if this benefits the yield (possibly per time unit). Further, other variables, if any, should not be excluded.

In a particular embodiment, the number of animals is variable. With this, account can be taken of the fact that this is also the case in practice. For instance, some dairy animals may become sick or not give milk for other reasons, so that in fact, they have to be removed from the model (no more milk yield). Something similar applies inversely to dairy animals that are added to the group. The model can easily be adjusted in such a way that the estimates for the total group are modified as soon as certain dairy animals are removed or added. Optima may shift by adding high-yield or, on the other hand, low-yield dairy animals. This is impossible or hardly possible to process in statistical models. In particular, a weighting factor for individual animals is included in the model. For instance, absent or (as the case may be) present dairy animals can easily be discounted with the weighting factors 0 and 1. If desired, intermediate weighting factors can also be included, for instance for sick dairy animals that do not produce useable milk but that are still to be included, at least partly, in the calculations because of feed costs.

The model is advantageously implemented in the computer and data regarding the group of dairy animals are preferably inputted in the computer, wherein subsequent individual milk yields are calculated by the computer by a model on the basis of said data. By doing so, the model can be adjusted with the data, after which the computer itself can recalculate values for rations and/or milking interval, etc. and adjust these where necessary. Of course, such recalculation can also take place without the aid of the computer, but using the computer makes a manager's job easier, to the extent that he no longer needs to be involved in such a regulatory step. Indeed, data such as milk yield, milk composition and may be also effective ration intake, or any other data as may appear to be useful at some later time, can be collected by the computer and the computer can make predictions and adjust the settings independently by use of built-in control logic or software which has been installed.

In certain embodiments, the model comprises a static model, with fixed coefficients. With such a model, optimum milk yield can in fact be calculated beforehand, i.e. independently of the measurements. The associated setting of the individual ration and, if desired, one or more of the variables such as individual milking interval, milk vacuum, suction/rest ratio, milking program, etc., can then also be given directly. Start data can be based on mean values known from the literature or, preferably, on historical data per dairy animal. If necessary, the model can be configured to build up progressively a concentrate supply, for instance by 0.5 kg/day and wherein then also the actual milk yield will grow to its optimum in a corresponding manner. However, the (optimum) final value will already have been fixed with the initial calculation by the model. Advantageously, the individual ration is optimised for a maximum result as a group. Preferably, however, new calculation and regulatory steps will be performed if the number of dairy animals changes, for instance, in case of sickness or upon purchase of dairy animals. It is to be noted that with all such models with fixed coefficients, no individual changes can be processed, such as changes over time, for instance, in the lactation cycle.

Incidentally, the utilized models can be various. For instance, it is accepted that the individual milk yield is quadratically dependent on the given ration, in which the milk yield increases ever more slowly as a function of the size of the ration. An optimum ration can thus be calculated per dairy animal, for instance for maximum milk yield, but often even more advantageously for maximum feed balance. This lies at a point either where the derivative towards ration of the Milk Yield (ration) or (Milk yield (ration)−Costs (ration)) function becomes nil. For a group of dairy animals, associated individual optima for the rations can be found by, for instance, individual optimisation if no preconditions are imposed (for instance, on milk quota, available milking time, etc.). As an example, if there is a precondition that there is an established milk quota, i.e. a total milk yield for the group of dairy animals, or a maximum available effective milking time, which actually can also be calculated backwards to a maximum total milk yield, individual settings can then be found by means of the regression theory, or in practice also, for instance, by varying individual rations with the precondition that the individual derivatives towards the ration are mutually all equal. Indeed, a group optimum is characterized by the condition that infinitesimal changes with each dairy animal must show the same effect on the total. The above can be implemented in computer programs.

In a further embodiment, the model comprises a Bayesian time series analysis model, with individual model coefficients and model variables that are at least partly time-dependent, and that comprise at least a milk yield per time unit, an individual adjusting variable, being a ration, as well as an individual incremental milk return per ration unit per time unit, wherein the model describes in an observation equation how one or more model variables depend on the model coefficients and model variables and, in a system equation, how the model coefficients evolve over time, and wherein the model comprises an adjusting criterion for at least one individual adjusting variable, that indicates how the individual adjusting variable is to be changed on the basis of model variables and model coefficients. A big advantage of a Bayesian model is that it can vary over time. One can thus take account of, for instance, biological processes, such as changes in the milk yield because a dairy animal goes through a lactation period, or because of sickness (for instance, milk yield may diminish from mastitis), etc. Indeed, such changes have an impact on the position of individual optima and thus also on the position of a group optimum. A Bayesian model, also often termed a "dynamic" model, for instance a "dynamic linear model", can take account of such changes. For instance, they are taken into account because the model is adapted on the basis of measured values. If these values deviate from predicted values, the Bayesian model assumes that it has to update itself (or have itself updated). Details on dynamic models and associated methods of assessment can be found in, for instance, West, M., Harrison, J., (1997), Bayesian Forecasting and Dynamic Models, Second Edition, Springer Verlag, New York. Elaborated examples of such a model will be discussed in the figure description. Such a model will specifically contain an observation equation that describes how the milk yield depends on the model variables and coefficients, as well as a system equation that describes how the model coefficients evolve over time. Some aspects of this will be described in more detail below. It is to be noted that a static model does not change when a measured value deviates from a predicted value.

Additionally, a dynamic model is also suitable for taking account of dynamic processes, such as price changes. When prices of either milk or rations or parts of these, such as concentrate or roughage, change, the positions of the optima may shift. Milk composition is also a dynamic factor over time, so that shifts may even occur per dairy animal.

With the use of such a Bayesian model, the control comprises in particular:

a) Collecting and inputting in the computer start data regarding the model variables and model coefficients for the dairy animals,
b) Generating, by means of the model, an individual prediction of the next milk yield per time unit for each dairy animal, dependent on the ration per time quantity and the individual milk return per ration unit per time unit,
c) Milking the dairy animals by using the milking device,
d) Determining the milk yield for each dairy animal,
e) Comparing each individual prediction with the associated determined milk yield,
f) Adjusting the individual model coefficients on the basis of the determined milk yields, using the model, in particular the system equation,
g) Recalculating the individual adjusting variable, by means of the adjusting criterion,
h) Adjusting the feeding device on the basis of the recalculated adjusting variable. This provides the steps, as such well known for application of a Bayesian system, to come to a model adjustment where this appears to be necessary.

In a further embodiment, steps b) through h) are repeated at least once and, in yet another embodiment, they are repeated in every time period.

In an embodiment, the method further comprises generating a notification signal if, during a predetermined number of times, in particular days, a realized milk yield deviates from the associated generated prediction or estimate by more than a predetermined first threshold value.

Such notification signals, which are based on deviating values, also sometimes referred to as "mavericks", are very useful for managing the group of dairy animals, because they allow a managing person who is indeed not present or not always present with the dairy animals to still receive a signal when a deviating value is measured. Such a signal can, for instance, relate to a lower milk yield, or a (much) shorter or longer milking interval, all of which may indicate that the dairy animal might be sick. Both statistical and Bayesian (dynamic) models can generate such notification signals. However, a huge advantage of a Bayesian model is that it is capable of adjusting itself over time. For instance, a slowly decreasing or increasing trend will not generate unnecessary notification signals, because the trend is also processed in the model.

In yet another embodiment, the method further comprises generating a notification signal if an observation deviates from the associated generated prediction by more than a predetermined second threshold value. In this method, a notification signal is at all times generated if the observation deviates too much from the prediction. In this case, generation of a notification signal is not delayed, because the situation might be too serious.

The invention also relates to a device for managing a group of dairy animals, comprising an animal recognition device for recognizing individual dairy animals within the group, a computer and an automatic feeding device controlled by said computer, wherein the computer is arranged to perform a method according to the invention. The computer can either be programmed in a suitable manner to that effect, or, for instance, comprise suitable hardware. Such a set-up provides the computer after calculation with an adjusting signal to adjust the feeding device, so that the device will supply the calculated individual ration to the identified dairy animal.

Some advantageous embodiments will be mentioned below and they will only be briefly reviewed because the associated advantages have already often been mentioned in the disclosures on the corresponding performance of the method.

Preferably, the device comprises a feed weighing device for weighing the ration consumed or its components. This allows feedback data to be obtained.

The automatic feeding device advantageously comprises a plurality of feed containers that are capable of supplying, individually and computer-controlled, a quantity of the related kind of feed. There is even more advantage if a feed mixing device is provided.

Advantageously, the device comprises an automatic milking system, which is preferably controllable by the computer and advantageously adjustable with respect to milk vacuum, suction/rest ratio, etc. Also the milking interval can be somewhat controlled, by not allowing a dairy animal in the device if the calculated milking interval has not yet elapsed. If desired, the computer can adjust the milking system based on the identity of the dairy animal, as established by use of the animal recognition device.

The computer will be arranged to receive and/or produce various data, such as an animal recognition signal and an adjusting signal for the feeding device or a signal regarding the size of the ration. Additionally, the computer should preferably comprise additional input devices for external data input, such as a price for milk or milk components, a price for feed, the number of animals in the group and changes to this, etc.

A model is implemented in the computer for calculation of the desired ration for individual dairy animals. This may be, for instance, a static model, with fixed coefficients. It can also be a Bayesian, i.e. dynamic model, with coefficients that can change over time under the influence of observations of variables such as effective individual milk yield. Further examples and details are given in the figure description.

The device is furthermore preferably arranged to produce a notification signal if there is a reason for this according to the model. This can take place in the form of an alarm signal to the manager, such as the farmer. This is especially useful in case of a strongly deviating value that, for instance, deviates from the prediction by more than the second threshold value. An audible signal, a signal to a mobile phone, such as an SMS, etc., is one useful way of doing this. It is also possible to establish a list of notification signals that can be made available upon request, for instance in the form of a printable list.

The invention also comprises a computer program product, comprising a computer-readable medium with computer program instructions embodied on said medium and capable of arranging a computer, in particular a computer of a device according to the invention, to perform a method according to the invention.

Depending on the method to be performed, the computer program instructions comprise calculation rules for implementing the model, for instance, a Bayesian (dynamic) regression model, processing rules for input data, implementation rules for calculated values, etc.

BRIEF DESCRIPTION OF THE DRAWINGS

The features and advantages of the invention will be appreciated upon reference to the following drawings, in which.

DESCRIPTION OF ILLUSTRATIVE EMBODIMENTS

Figure 1:
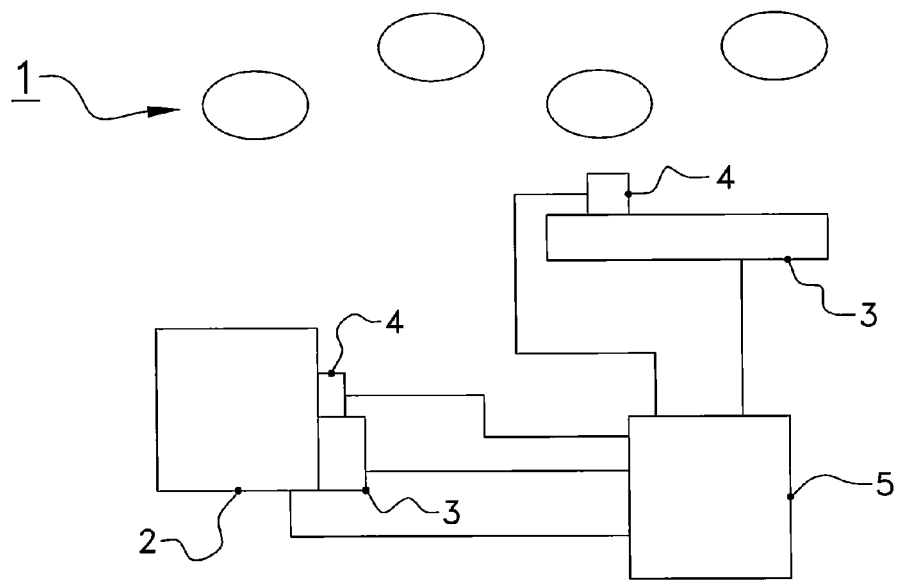
FIG. 1 is a schematic diagram of a device for managing a group of dairy animals according to an embodiment of the invention.

The following is a description of certain embodiments of the invention, given by way of example only and with reference to the drawings. FIG. 1 shows very schematically a device according to the invention. At the top, there is a group of dairy animals 1, whereas 2 is an automatic milking system (AMS), 3 is an individual feed system (IFS), 4 is an animal recognition system (ARS) and 5 is a computer linked with every one of these systems.

It should be noted that the IFS may consist of a plurality of units supplying rations at different locations, for instance concentrate at the AMS and roughage at resting places, etc. For this reason, the IFS has been drawn here as consisting of two parts and an animal recognition system 4 is provided for both parts. Other quantities are possible. In addition, it is to be noted that the computer is optional for the exemplary embodiments that are outlined here, because all calculations and adjustments can also be done by hand. However, for the sake of convenience, it will always be assumed in what follows that such a computer is present.

The automatic milking system 2 receives an identification signal via the animal recognition system 4 and retrieves the information belonging with the dairy animal in question, such as milk settings. For instance, the AMS 2 can measure the quantity of given milk and, in an advantageous embodiment, even define its composition and offer this information to the computer 5. Alternatively, the composition can be determined externally and the data can then be entered into the computer 5.

The IFS 3 can offer the dairy animal an individual amount of feed (i.e. a ration). Such feed comprises at least concentrate (concentrate) and especially also roughage, either separately or subsequently mixed. If desired, also other kinds of feed, supplements, etc., can be offered. The IFS 3 is controlled by the computer 5, on the basis of an adjusting variable that represents the ration for the dairy animal in question. In this, it is assumed that the dairy animal will eat the ration entirely. In practice however, there may be a difference between the offered ration and what is actually eaten, so that it is advantageous when the IFS 3 can also measure the effectively eaten quantity and send this to the computer 5. If necessary, the computer 5 can then adjust the model on the basis of the measured quantities.

A computer program is loaded in the computer 5, which contains instructions by which the computer 5 is capable of implementing the method according to the introduction. The method comprises implementing a Bayesian analysis model that will be described below in order to illustrate the method, as well as in FIGS. 2 and 3 in which the method is presented in a flow diagram.

Figure 2:
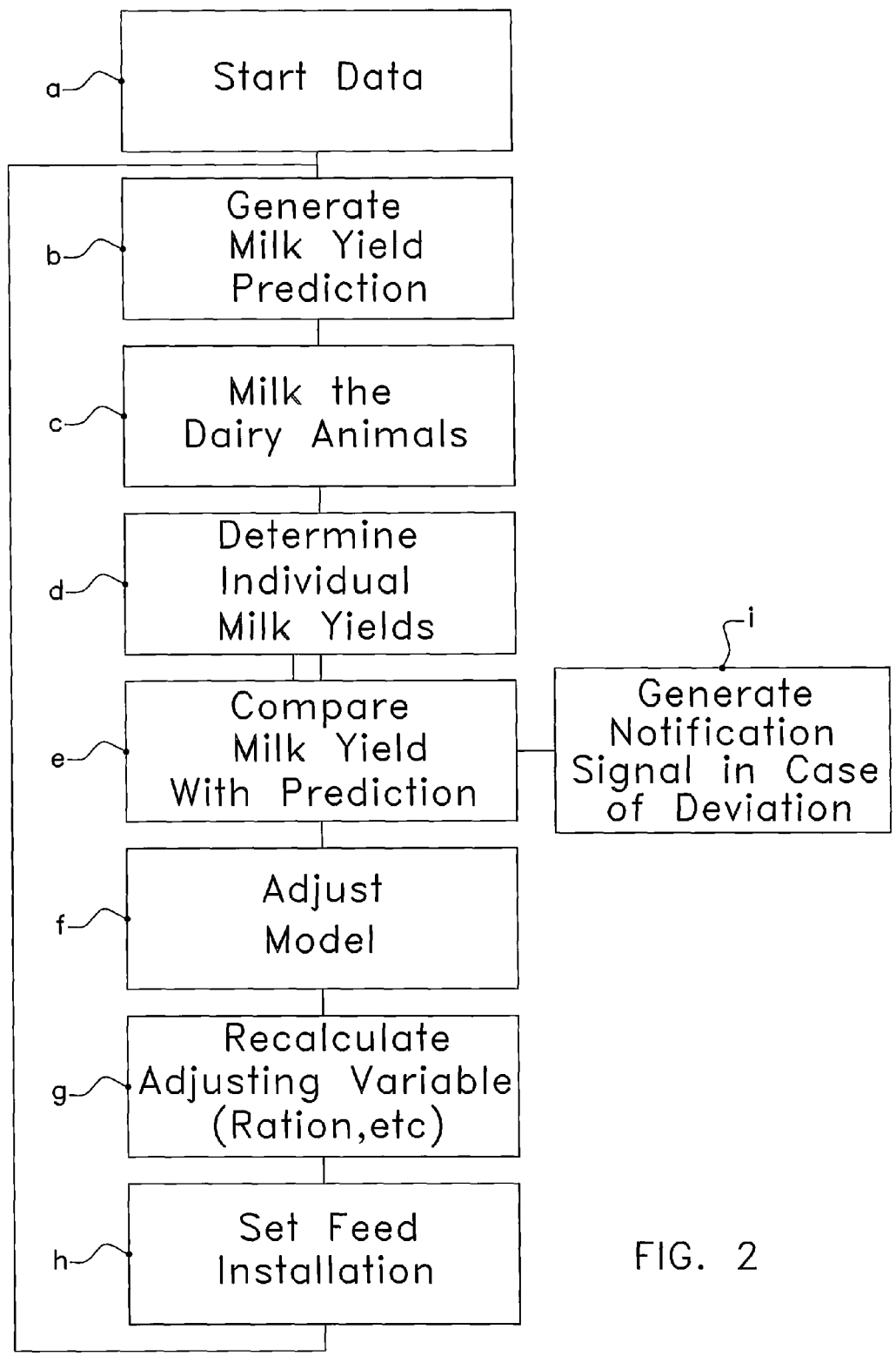
FIG. 2 is a block diagram of the system for managing a group of dairy animals according to an embodiment of the present invention.

FIG. 2 shows the steps a) through h), with a repetition step (optional) from h) back to b) and with an extra action i) (optional) to generate a notification signal. Step a) comprises the preparation of the model, in this case the computer, by the collection and input of start data. It is assumed that the computer program is already installed in the computer. These are the data that are necessary to allow one to make an initial prediction for the individual milk yield. Of course, the quantity and kinds of start data will depend on the model chosen. Such start data can be obtained from historic data, for instance from a prior lactation period, or for instance from starting measurements, in which in fact only steps c) and d) are gone through and repeated until there are sufficient data available. It is to be noted that, if we assume that the ration is not completely eaten and if we wish to define the ration actually consumed, there will have to be an extra step (in the repeat loop), for instance in the form of a step j): 'define the ration actually consumed'. If necessary, step j) can be included in the collection of start data.

The computer now has sufficient data to predict an individual milk yield in step b). Then, the dairy animal is milked in step c) and the individual milk yield is determined in the AMS in step d). In step e), the individual milk yield is compared with the matching prediction. On the basis of the difference between these, an optional notification signal can be generated in step i), for instance, if that difference is greater than a predetermined threshold value, or if the difference in one or more (immediately) preceding periods has been greater than an identical or smaller threshold value.

In step f), the utilized model can be adjusted based on the defined milk yield and, if applicable, on the ration actually consumed as determined in the optional step j) and, if applicable, on the basis of data input regarding prices, etc. This means that the model coefficient(s) is/are recalculated. This will happen, for instance, if a dairy animal is showing decreasing ration sensitivity or a lower basic milk yield.

In step g), the computer calculates a new value for the ration to be given and in step h), it adjusts for instance an IFS and, if applicable, also an AMS accordingly. Then, steps b) through h) can be repeated. In this manner, the system will refine ever further or at least be capable of adjusting itself to changing conditions.

Generally speaking, two major improvements according to the present invention are that an individual milk yield, as well as an associated ration, is adjusted and optimised under application of a precondition and in particular in a manner that a return is optimised at herd level instead of at individual level and that a dynamic (Bayesian) model is used, which can adjust itself over time on the basis of measured milk yields and similar values.

Figure 3:
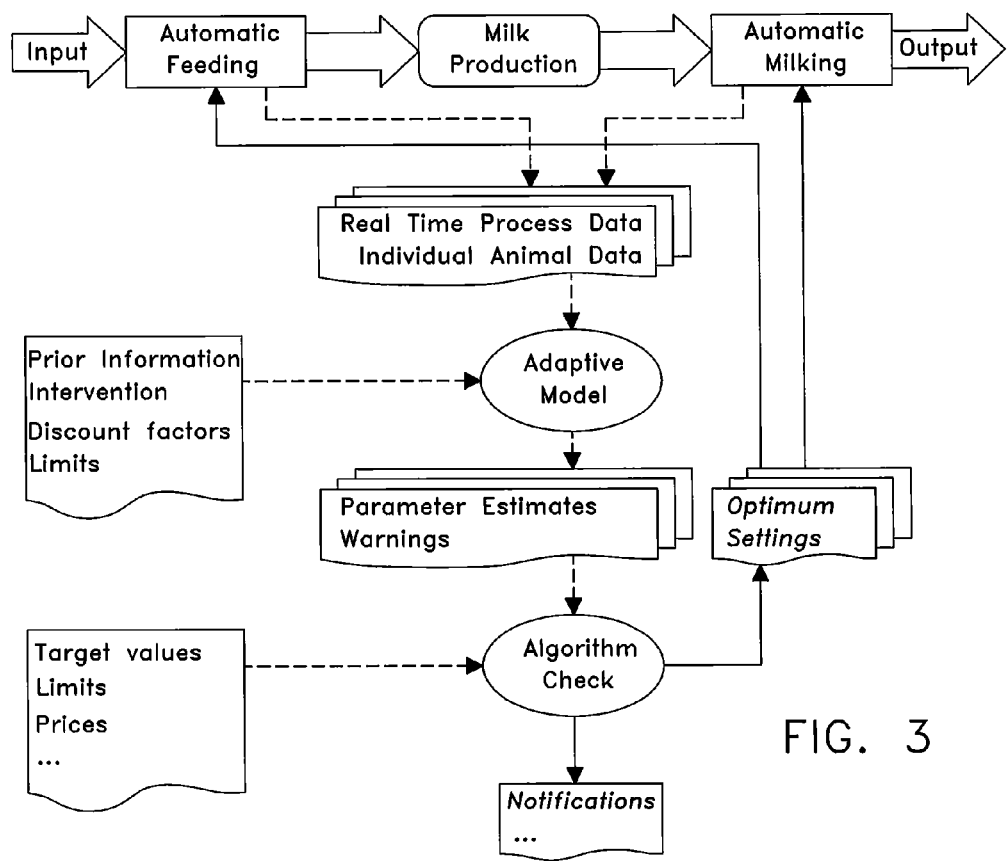
FIG. 3 is a method for managing a group of dairy animals according to an embodiment of the invention.

Below, we will find some further explanations of a sample model, as schematically shown in FIG. 3. For better understanding, we can imagine the model as being split in two parts, an adaptive model and a verification/control algorithm. The adaptive model comprises the time series analysis model, with input possibility for values of model variables and updating of the model coefficients. The adaptive model generates estimates of the other variable(s) and, if desired, a warning signal on the basis of the inputs and/or the calculated estimate.

The updated and estimated values are then offered to the verification/control algorithm. This algorithm can then calculate an updated optimisation for the adjusting variable(s) by an adjusting criterion and in an advantageous embodiment under application of the precondition. External data can be added to the adjusting criterion, such as a milk price (change) and feed prices. If applicable, the algorithm can control the warning generated by the adaptive model (notification signal), or itself generate a notification signal or a new notification signal.

For instance, the adaptive model can be based on the following assumptions and corresponding equations:
1) The total milking duration D per dairy animal, is approximately linear with respect to the number of milking sessions N:

$$D = a_0 N + a_1 M \qquad (1.1)$$

in which a0 is handling time per milking session and a1 is inverse effect of milk flow (minutes/kg).

2) The accumulated milk yield (M) per dairy animal per period is approximately a quadratic response surface with respect to the intake of concentrate per day (C) and interval times, or intermediate milk times, ($I_j$):

$$M = (c_0 + c_1 C + c_2 C^2) \sum_j I_j + b2 \sum_j I_j^2 \qquad (1.2)$$

in which the following individual dynamic coefficients are defined: $c_0$ basic milk yield (kg/day), $c_1$ linear effect of concentrate intake (kg/kg/day), $c_2$ quadratic effect of concentrate intake (kg/kg$^2$/day), $b_2$ quadratic effect of interval length (kg/day$^2$), and in which j is the summing variable that relates to the milking sessions in that period.
3) The roughage intake per day, R, in response to concentrate intake C is approximately linear:

$$R = d_0 + d_1 C \qquad (1.3)$$

in which $d_0$ basic is level of roughage intake (kg) and $d_1$ linear is effect of concentrate intake (kg/kg).

It is to be noted that (1.1) in this model is in fact only used when optimising the milking time in the AMS and that it is not needed for modelling of the optimum rations, for instance, because there is unlimited milk capacity available. Furthermore, in (1.2), a quadratic dependency is here assumed. However, it is most certainly also possible to adopt another dependency, such as a linear or a random, empirically defined dependency. However, the model, as it is used here, provides good results. Furthermore, it is not always necessary to model roughage intake as in (1.3), for instance, when it is freely available. However, in this model, roughage intake is modelled, which is for instance handy if a price for roughage is indeed to be calculated.

In the above model, there are 3 response variables, i.e. milking duration D, milk yield M and roughage intake R per day. There are 4 regression variables: number of milking sessions N, milk yield M (thus a dual function!), concentrate intake C and interval length I. Per dairy animal per day, there are 8 coefficients (a0, . . . , d1) that describe the impacts of milking frequency and concentrate allocation on milk yield and that also each have an obvious physical and/or biological significance. Furthermore, use is made of a system equation that can be summarized as $\theta_t = \theta_{t-1} + \delta$,
in which $\theta_{t(-1)}$ is a coefficient at time $\bar{t}$ or, alternatively, t−1 and δ an interference. For modelling, use is made of a number of time periods to be selected, for instance days, which have an impact on the "new" coefficient, via a discount factor. This is a weighting factor that indicates how large the importance of a related previous coefficient value is when calculating the new value. For instance, a discount factor of 0.8 indicates that a value of three periods back still has a weight of $0.8^3 = 0.256$. This way, older values will thus continuously have less weight in the model. Usually, the discount factor lies between 0.8 and 0.98, can be different for each corresponding coefficient and can, for instance, be defined empirically from test measurements. It is to be noted that the respective discount factors themselves do not change.

The way in which coefficients interrelate, i.e. the system equation, is somewhat dependent on the selected regression method. For a dynamic linear regression method, which is often used, we refer to the above-mentioned book by West & Harrison, in particular summarizing table 10.4 on page 362, included here as Table I, with associated explanations, which is hereby incorporated by reference.

TABLE I

Univariate DLM with variance discounting

| | |
|---|---|
| Observation: | $Y_t = F'_t \theta_t + v_t$, $v_t \sim N[0, k_t/\phi_t]$ |
| System: | $\theta_t = G_t \theta_{t-1} + \omega_t$, $\omega_t \sim T_{nt-1}[0, W_t]$ |
| Precision: | $\phi_t = \gamma_t \phi_{t-1}/\delta$ |
| | With $\gamma_t \sim \text{Beta}[\delta n_{t-1}/2, (1-\delta)n_{t-1}/2]$ |
| Information: | $(\theta_{t-1} \mid D_{t-1}) \sim T_{nt-1}[m_{t-1}, C_{t-1}]$ |
| | $(\theta_t \mid D_{t-1}) \sim T_{nt-1}[a_t, R_t]$ |
| | With $a_t = G_t m_{t-1}$, $R_t = G_t C_{t-1} G'_{t-1} + W_t$ |
| | $(\phi_{t-1} \mid D_{t-1}) \sim G[n_{t-1}/2, d_{t-1}/2]$ |
| | $(\phi_t \mid D_{t-1}) \sim G[\delta n_{t-1}/2, \delta d_{t-1}/2]$ |
| | With $S_{t-1} = d_{t-1}/n_{t-1}$ |
| Forecast: | $(Y_t \mid D_{t-1}) \sim T_{\delta n_{t-1}}[f_t, Q_t]$ |
| | With $f_t = F'_t a_t$, $Q_t = F'_t R_t F_t + S_{t-1}$ |

Updating Recurrence Relationships $(\theta_t \mid D_t) \sim T_{nt}[m_t, C_t]$
$(\phi_t \mid D_t) \sim G[\eta_t/2, d_t/2]$
With
$m_t = a_t + A_t e_t$,
$C_t = (S_t/S_{t-1}) [R_t - A_t A'_t Q_t]$,
$\eta_t = \delta n_{t-1} + 1$, $d_t = \delta d_{t-1} + S_{t-1} e_t^2/Q_t$
$S_t = d_t/n_t$,
Where $e_t = Y_t - f_t$ and $A_t = R_t F_t/Q_t$.

The symbol names used in this differ from the ones used here although their function does correspond. Estimation of the coefficients is based on the described univariate dynamic linear models with variance discounting. In table G, we find a (matrix) coefficient that indicates the evolution of the corresponding model coefficient over time and thus, for instance, indicates a possibly steady trend. However, in the present model (given as an example), we opted for not introducing a steady (prior) trend but to process the time evolution passively and to have the model adjusted through observations. In other words, G is here the unit matrix. In addition, the discount factors in table 10.4 are indicated as δ.

The milk yield M is modelled according to above model, as a function over time of interval length and concentrate intake. In this model, we must start from initial values for the coefficients and interval lengths, i.e. start data, which are, for instance, based on earlier lactation periods of the dairy animals, or on animal averages. Furthermore, a starting value, or a series of starting values must be adopted for concentrate intake, which is in fact an adjusting variable. However, often a "start-up period" is carried out, in which concentrate administration is slowly built up from 0 and by which the first values for C are established. A first model estimate for milk yield M is then generated by means of these start data. This yield is subsequently effectively measured.

Subsequently, optimum individual settings for rationing and, if desired, milking interval, can be calculated by solving the series of equations. For instance, the optimum individual ration $C_{Opt, it}$ can be calculated as $$C_{Opt,it} = \frac{-(\pi_{M,it} c_{1,it} - \pi_{C,it} - \pi_{R,it} d_{1,it})}{2 \pi_{M,it} c_{2,it}}$$

in which $\pi_M$, $\pi_C$ and $\pi_R$ are respectively the milk price (not split according to composition), the concentrate price and the roughage price and the subscript factors i and t indicate respectively the dairy animal and the time. This equation is obtained by differentiating the feed balance, i.e. the product of milk yield and price minus the sum of the products of feed quantities and their price according to the concentrate quantity C and by putting this derivative at zero. It is to be noted that these optima are calculated here at individual level. When optimising at herd level, the expressions become a little more complicated. However, these can also be approximated by iterative methods and this is often the only useable method in actual practice. Packages are available for this, such as for instance GAMS of GAMS Development Corporation, Washington, D.C. 2006.

In a similar manner, a setting for, for instance, an optimum individual milking interval IOpt, it can be obtained, under the precondition that the sum of the milking times Dit equals at the most the maximum effective milking time DMax, t, as $$I_{Opt,it} = \left\{ b_{2,it} \left( \frac{a_{1,it} - \pi_M \gamma(D_{Max,t}, H_t)}{a_{0,it}} \right) \right\}^{-1/2}$$

in which $\gamma(D_{Max, t}, H_t)$ is a function that depends on the maximum available AMS capacity $D_{Max, t}$ and the size $H_t$ of the group of dairy animals:

$$\gamma(D_{Max,t}, H_t) = \frac{\overline{a_1}}{\pi_M} - \frac{\overline{a_0}}{\pi_M b_2} (\overline{I_{Opt}})^{-2}$$

in which $\overline{I_{Opt}}$ is the mean optimum milking interval, to be calculated by differentiating mean milking duration D according to mean feed balance S and by making $D(I_{mean})$ equal to $D_{Max, t}/H_t$.

In fact, the above equations are derived under the assumption that optimum milking interval and optimum ration are independent variables. The equations will thus provide a suboptimal result. Again, more accurate solutions can be obtained, for instance, by means of the above-mentioned software package.

Apart from this, even more preconditions can be imposed, such as a milking interval that is kept between 4.8 and 12 hours, or that there is to be a predetermined minimum portion of roughage in relation to total feed intake, say for instance 40%. Also changes can be maximized, for instance, the number of milking sessions per day may change by 0.5 at the most or the concentrate ration may change by 0.5 kg per day at the most. For instance, one may also require that a maximum milking interval is at the most 1.3 times the optimum milking interval, after which the milk is collected, etc. Such preconditions may cause the creation of notification signals if an observation on a dairy animal falls outside such imposed limits.

It is again stressed here that two major advantages of the invention include that the settings for feed ration and, if applicable, milking interval, are optimised at herd level instead of at individual level and that, in such optimisation, use is made of a dynamic system that takes better account of the dynamic factors, such as dairy animals.

The invention was tested in a practical test. In this, (on average) 71 cows were observed during a period of 3 months. For these cows, optimum settings were sought (repeatedly) in accordance with the model described above and the returns in terms of milk and in feed balance, milking frequency, feed intake, etc., were looked at. Table II below shows that, compared with return predictions, etc., with traditional settings, there was an obvious increase in, for instance, mean feed balance, in other words the total feed balance at herd level.

TABLE II

Comparison of traditionally and dynamically predicted results

|  | Traditionally Predicted | Dynamically, Optimally Predicted |
| --- | --- | --- |
| Milking frequency (#/cow/day) | 2.71 | 3.25 |
| Concentrate administration (kg/cow/day) | 5.7 | 6.4 |
| Milking duration (min./cow/day) | 14.4 | 15.9 |
| Roughage intake (kg/cow/day) | 31.3 | 32.1 |
| Milk yield (kg/cow/day) | 31.5 | 33.6 |
| Feed balance (€/cow/day) | 7.23 | 7.77 |

The table shows that the return per cow can increase, for instance by making more feed and/or milking time available, mainly or only to high-yield cows. In this way limits can be explored in a better way than by means of traditional models. Moreover, it appeared from differences in settings for individual cows (not shown here) that some (high-yield) cows received more feed and/or milking time, whereas other (low-yield) cows received less of these than in the traditional model.

Thus, the invention has been described by reference to certain embodiments discussed above. It will be recognized that these embodiments are susceptible to various modifications and alternative forms well known to those of skill in the art. Further modifications in addition to those described above may be made to the structures and techniques described herein without departing from the spirit and scope of the invention. Accordingly, although specific embodiments have been described, these are examples only and are not limiting upon the scope of the invention.

What is claimed is:

1. A method of managing a group of a plurality of dairy animals, comprising the steps of:
   individually recognizing each animal by an animal identification system,
   milking the animals to give actual milk yields for each animal,
   feeding the animals with a predetermined individual ration, and
   collecting data regarding the group of dairy animals, the data comprising for each animal at least the actual milk yield and an amount of the individual ration consumed by the animal,
   wherein subsequent individual milk yields are estimated using a model on the basis of the collected data, and
   wherein, for one or more animals, at least one of the individual ration and the milking of individual dairy animals is adjusted in a regulatory step of the model using a precondition; and wherein the precondition comprises that a predicted feed balance of an individual dairy animal is higher after the regulatory step than an actual feed balance prior to the regulatory step, wherein the actual feed balance is equal to a return of an associated actual milk yield minus the costs of the associated actual predicted ration, and the predicted feed balance is equal to a return of an associated predicted milk yield minus the costs of the associated predicted ration.

2. The method according to claim 1, wherein the precondition comprises that, for the group as a whole, the sum of predicted feed balances of individual dairy animals after the regulatory step is larger than the sum of actual feed balances prior to the regulatory step.

3. The method according to claim 1, wherein the ration comprises an amount of concentrate per day or an energy equivalence thereof.

4. The method according to claim 3, wherein the ration further comprises at least a second kind of feed.

5. The method according to claim 4, wherein the second kind of feed comprises an amount of roughage.

6. The method according to claim 1, wherein the animals are fed at least partly by a computer-controlled feeding device.

7. The method according claim 1, wherein the precondition comprises that a sum of the individual milk yields does not exceed a predetermined milk quota.

8. The method according to claim 7, wherein the model is implemented in a computer.

9. The method according to claim 1, wherein the precondition comprises that a total duration of milking all dairy animals is at most equal to an effective daily milking time.

10. The method according to claim 9, wherein the effective daily milking time is measured as a function of said effective daily milking time in a predetermined number of previous days.

11. The method according to claim 10, wherein the function comprises a running average of the effective daily milking time in a predetermined number of previous days.

12. The method according to claim 1, wherein the animals are milked automatically by a milking device, which is preferably computer-controlled.

13. The method according to claim 12, wherein the precondition comprises that a total duration of milking all dairy animals by the milking device is at the most equal to an effective daily milking-time of the milking device.

14. The method according to claim 12, wherein at least one of a milking interval, a milk vacuum, a suction/rest ratio during milking, and a milking program for application during milking is adjustable.

15. The method according to claim 1, wherein the number of animals is variable.

16. The method according to claim 15, wherein a weighting factor for individual animals is included in the model.

17. The method according to claim 1, wherein data regarding the group of dairy animals are inputted in a computer, wherein subsequent individual milk yields are calculated by the computer by a model on the basis of said data.

18. The method according to claim 1, wherein the model comprises a static model with fixed coefficients.

* * * * *